(12) United States Patent
Shapiro

(10) Patent No.: US 10,884,050 B2
(45) Date of Patent: Jan. 5, 2021

(54) TEST OF STACKED TRANSISTORS

(71) Applicant: pSemi Corporation, San Diego, CA (US)

(72) Inventor: Eric S. Shapiro, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 292 days.

(21) Appl. No.: 15/188,788

(22) Filed: Jun. 21, 2016

(65) Prior Publication Data

US 2017/0363676 A1    Dec. 21, 2017

(51) Int. Cl.
*G01R 31/26*    (2020.01)
*H03K 19/0175*    (2006.01)
*H03K 19/20*    (2006.01)
*H03K 19/21*    (2006.01)
*H01L 27/12*    (2006.01)

(52) U.S. Cl.
CPC . *G01R 31/2621* (2013.01); *H03K 19/017509* (2013.01); *H03K 19/20* (2013.01); *H03K 19/21* (2013.01); *H01L 27/1203* (2013.01)

(58) Field of Classification Search
None
See application file for complete search history.

(56) References Cited

U.S. PATENT DOCUMENTS

| | | | |
|---|---|---|---|
| 6,804,502 B2 | 10/2004 | Burgener et al. | |
| 7,719,343 B2 | 5/2010 | Burgener et al. | |
| 7,796,969 B2 | 9/2010 | Kelly et al. | |
| 7,910,993 B2 | 3/2011 | Brindle et al. | |
| 8,129,787 B2 | 3/2012 | Brindle et al. | |
| 9,503,074 B2 * | 11/2016 | Aubain | H03K 17/162 |
| 9,780,778 B2 * | 10/2017 | Burgener | H03K 17/063 |
| 9,948,281 B2 * | 4/2018 | Ranta | H03K 17/687 |
| 2011/0254614 A1 * | 10/2011 | Huang | H03K 17/063 |
| | | | 327/534 |
| 2015/0349770 A1 * | 12/2015 | Bakalski | H04B 1/006 |
| | | | 455/78 |

* cited by examiner

*Primary Examiner* — Paresh Patel
(74) *Attorney, Agent, or Firm* — Jaquez Land Greenhaus LLP; Alessandro Steinfl, Esq.

(57) ABSTRACT

A stack of series coupled transistors comprising, at least two sub-portions of the stack of series coupled transistors, and at least one logic decoder coupled to the at least two sub-portions to turn ON at least one sub-portion.

22 Claims, 9 Drawing Sheets

TEST OF STACKED TRANSISTORS

CROSS-REFERENCE TO RELATED APPLICATIONS

U.S. Pat. No. 7,796,969 entitled "Symmetrically and asymmetrically stacked transistor group RF switch", U.S. Pat. No. 6,804,502 entitled "Switch circuit and method of switching radio frequency signals", U.S. Pat. No. 7,719,343 entitled "Low noise charge pump method and apparatus", U.S. Pat. No. 8,129,787 entitled "Method and apparatus for use in improving linearity of MOSFETS using an accumulated charge sink" and U.S. Pat. No. 7,910,993 entitled "Method and apparatus for use in improving linearity of MOSFETS using an accumulated charge sink" are incorporated herein by reference in their entirety. Where a definition or use of a term in an incorporated reference is inconsistent or contrary to the definition of that term provided herein, the definition of that term provided herein applies and the definition of that term in the reference does not apply.

BACKGROUND

(1) Technical Field

The present disclosure relates to testing of stacked transistors and more specifically to design for test of stacked transistors.

(2) Background

Design for test has been a concept applied to complex circuitry in order to reduce test times. Stacked transistors are utilized to distribute an input voltage across a string of series connected transistors. This voltage distribution ability allows stacked transistors to be used in radio frequency front ends. The high voltage handling capability also creates a related complication in test in which a higher test voltage is needed to test the device. The higher test voltage is more difficult to generate and accurately measure. What is needed is a design that will allow transistor testing to be partitioned for a lower testing voltage.

SUMMARY OF THE INVENTION

In an embodiment a stack of series coupled transistors comprising, at least two sub-portions of the stack of series coupled transistors, and at least one logic decoder coupled to the at least two sub-portions to turn ON at least one sub-portion.

In an embodiment a stack of series coupled transistors comprising, at least two sub-portions of the stack of series coupled transistors, at least one level shifter coupled to at least one sub-portion of the at least two sub-portions and at least one logic decoder coupled to the at least one level shifter to turn ON the at least one sub-portion.

In an embodiment a stack of series coupled transistors comprising, a first portion of the stack of series coupled transistors, a second portion of the stack of series coupled transistors, a first level shifter coupled to the first portion, a second level shifter coupled to the second portion and a logic decoder coupled to the first level shifter and the second level shifter to turn ON at least one of the first portion and the second portion.

In an embodiment a stack of series coupled transistors comprising, at least one sub-portion of the stack of series coupled transistors, at least one level shifter coupled to the at least one sub-portion and at least one logic decoder coupled to the at least one level shifter to turn ON the at least one sub-portion.

In an embodiment a stack of series coupled transistors comprising, at least one of the stack of series coupled transistors having at least one gate, at least one drain and at least one source, at least one blocking capacitor coupled to at least one of the at least one drain and at least one source, at least one inverter having at least one inverter output coupled to the at least one gate and at least one inverter input coupled to at least one of the at least one drain and at least one source and at least one logic decoder coupled to the at least one inverter to select the at least one inverter.

In an embodiment a method of testing a transistor stack comprising, receiving at least one decoder signal, setting a state of at least one level shifter based on the at least one decoder signal and turning ON at least one portion of the transistor stacked based on the state of the at least one level shifter.

In an embodiment a method of testing a transistor stack comprising, receiving at least one decoder signal and turning ON at least one portion of the transistor stacked based on the received at least one decoder signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
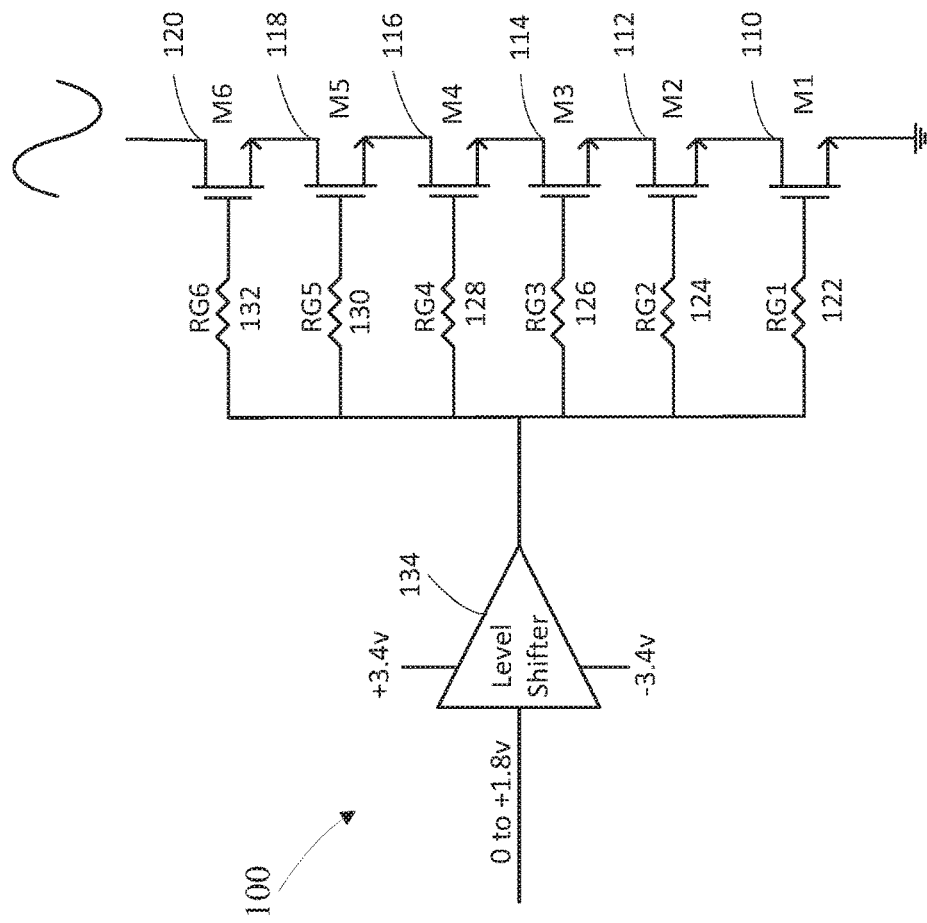
FIG. 1 is an overview of a prior art system.

One type of high power, high voltage, integrated circuit (IC) makes use of silicon on insulator (SOI) field effect transistors (FET) in a stacked string to distribute an incoming voltage. The SOI FETs are isolated from one another and have transistor bodies that are not connected to ground. The transistors in the stack have substrates that float electrically and the stacked transistor string have series connected sources and drains. As the transistor stack height increases, the ability to withstand high voltage swing increases and with it production test power for a compression point, harmonics, timing and defect screening.

As the power and voltage swing requirements increase, the designed stack height is increased to distribute the RF swing across individual devices. Separate gate bias resistors for FET elements isolate the RF and allow the drain-gate and gate-source capacitances to couple the signal to the gate so the device self-protects during the high swing conditions. Using a series of test access functions, the individual portions may be tested at lower RF input power levels.

A 1 dB compression point is defined by the point at which the Pout versus Pin deviates from an ideal linear relationship by 1 dB. For example, if Pout=Pin−0.5 dB for lower power levels, the Pin for which Pout=Pin−1.5 dB is the 1 dB compression point.

One possible solution to this dilemma of testing high power transistor stacks is to individually control the transistors in the stack to effectively decrease the stack height. This may be accomplished by turning ON a portion of the stack to be able to test a portion of the stack at a lower voltage swing. The stack may be separated into groups of transistors that are turned ON and OFF simultaneously or individually turned ON and OFF. In essence, portions of the OFF-stack are isolated for voltage swing testing by setting other portions ON.

The higher the transistor stack height, the more linear the response of the system. Thus stack height may be increased not just to increase power handling abilities, but also to increase linearity of response.

Therefore, turning ON a portion of the transistor stack increases the relative non-linearity of the response. This increased non-linearity may be sought for testing purposes in which sub-portions of the stack may be stressed to measure non-linearity of the system.

As the stack is biased, the capacitance of the stack changes. The transistors are connected in series in the stack, biasing transistors OFF allows a review of the capacitance of the drain to the source (Cds). This biasing of the transistor stack and subsequent modulation of Cds allows testing of the RF system.

The apparent detractions caused by turning ON and OFF portions of the stack are used to advantage in testing; the effectively reduced stack height allows testing at a lower voltage, allows a review of the non-linearity of the transistors at a lower voltage, allows a review of the RC response and capacitance of the stack. This temporary reduction of the stack does not improve the performance of the part, but does allow the part to be tested in a more cost effective and efficient manner.

The instant disclosure may depict a design for test approach for products with switch elements. The logic allow partitioning of the transistor stack and thus allow testing in aggregate of higher power and voltage swings utilizing a testing environment that may be limited in power or linearity. The instant disclosure may provide possible solutions for design for test, design for debug, and design for adjustment of the transistor stack.

Using separate level shifter controls for at least one upper portion and at least one lower portion of the transistor stack allows the portions to be tested individually with lower power automated test equipment (ATE). In one example, separate level shifters control the upper and lower portions. This can be extended to additional portions beyond two if the stack height or ATE system boundaries require it.

Individual level shifter controls may allow control for measuring a switching speed in a partially activated state to in part validate the proper device operation and screen for defects. This feature may allow gate bias resistor testing to insure correct functioning and test for defects within the active portion being tested.

A single pole multiple throw (SPxT), a multi pole multi throw (MPxT), a digital step attenuators (DSA) test set, a phase shifter, or the like may be used in conjunction with the level shifter. Level shifters provide the signal levels required to bias a transistor to a particular voltage. For example, a level shifter may take an input signal that swings from 0V to +3V and provide an output that swings from −3V to +3V. Digital step attenuators provide adjustable attenuation from 0 to an RF output of X dB in a series of Y dB steps. Attenuation may be set by a stream of data that is clocked into the shift registers by a clock signal and the attenuation state is set by selecting a bias voltage. A phase shifter is a device used to change the phase between two RF inputs and a single pole multi throw switch is a switch that routes an electrical signal from one input to one of multiple outputs.

By introducing separate level shifter controls for the upper portion and lower portions of the switch stack, the portions may be tested individually with lower power automated test equipment utilizing a more cost-effective setup and hardware configuration.

Individual transistors being turned ON and OFF may allow testing for transitions and timing of the individual transistors. In one example, utilizing the design for test to temporarily adjust the stack height may delay the timing of one portion of the circuit to another to lessen an instantaneous load.

FIG. 1 depicts a prior art system in which the entire string of stacked transistors is tested as a whole. In this example the stack is six transistors M1 110, M2 112, M3 114, M4 116, M5 118 and M6 120, having gate resistors RG1 122, RG2 124, RG3 126, RG4 128, RG5 130 and RG6 132. The stack is controlled by a signal from a level shifter 134. The level shifter output can be controlled to bias the FETs ON or OFF. In this case, the voltage from M1-M6 is quasi equally distributed through the stack and so testing the stack comprises a high input voltage across the stack that is supplied by the tester.

As the size of the stack is doubled, the voltage required to test the stack doubles. Therefore if the size of the stack to be tested is cut in half, the voltage required to test the stack is also cut in half. This halving of the test voltage makes the testing easier, but also increases the non-linearity of the half-stack and thus allows the purposefully degraded linearity of the stack to be tested.

If a stack of 3 transistors is being tested, the stack may have a 1 dB compression point of 26 dBm. If the stack is doubled to 6 transistors it would increase the 1 dB compression point to a 32 dBm equivalent swing, which is 6 dB higher and which doubles the input voltage swing necessary to test it. In this example, the 6 transistor stack may be separated into two stacks of 3 transistors. It may be possible to test by turning ON the bottom 3 transistors while keeping the top 3 transistors OFF, and confirm performance at lower frequencies to see whether the 1 dB compression point is at least 26 dBm. Then the process may be repeated to test the other half of the stack by turning ON the top 3 transistors and turning OFF the bottom 3 transistors. This process may be expanded to any size stack height, such as splitting a stack of 24 transistors that may have a 1 dB compression point of 44 dBm, into two 12 transistor stacks that have a 1 dB compression point of 38 dBm.

Figure 2:
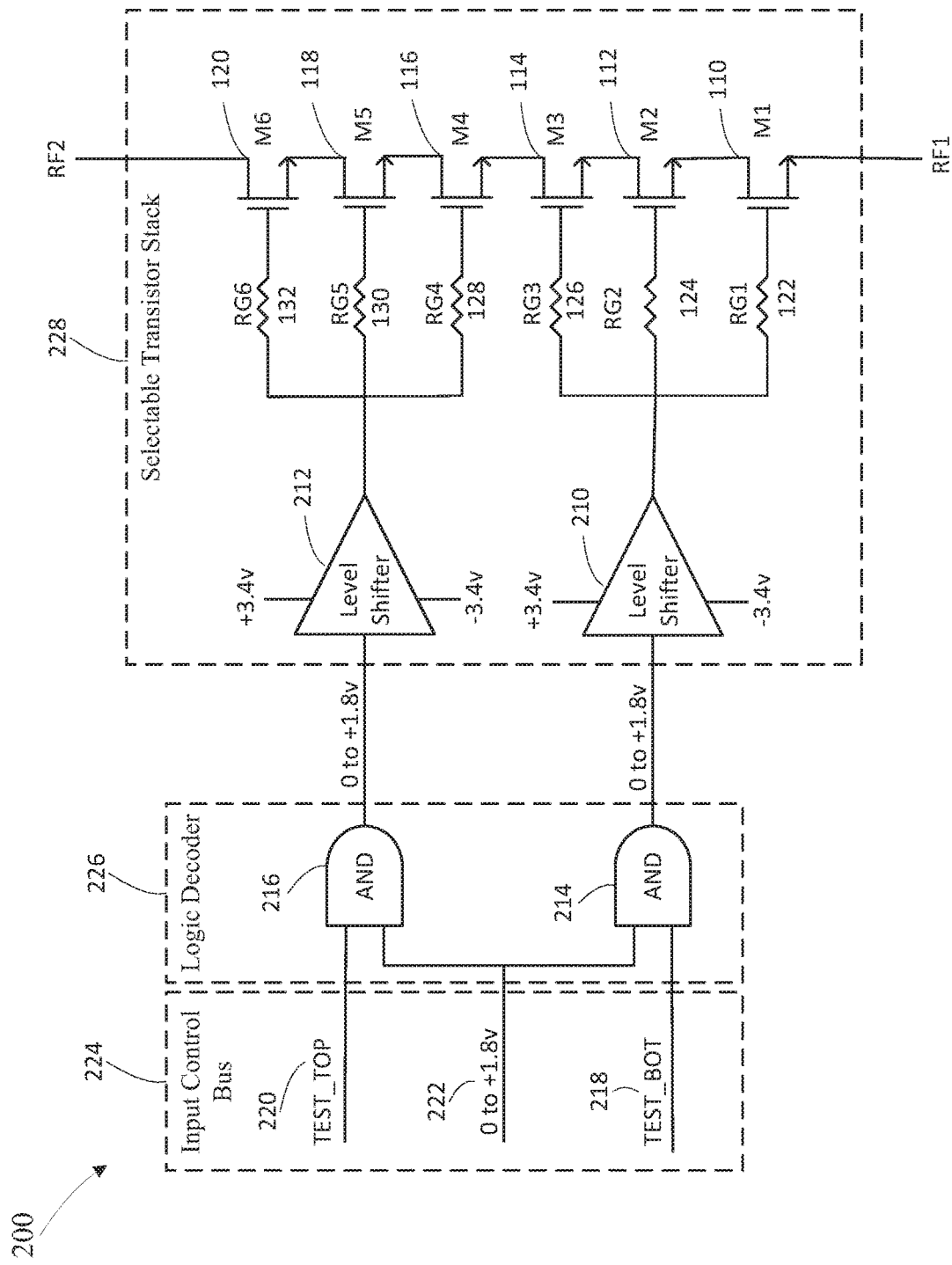
FIG. 2 is a first example system in accordance with one embodiment of the disclosure.

FIG. 2 depicts a first embodiment of a stack of series coupled transistors M1 110, M2 112, M3 114, M4 116, M5 118 and M6 120 that have been designed for test. The system comprises three overall parts, an input control bus 224, a logic decoder 226 coupled to the input control bus and the selectable transistor stack 228 responsive to the logic decoder.

The input control bus 224 in this example receives control three signals, a TEST_BOT signal 218, a TEST_TOP signal 220 and a customer control signal 222. The input control bus may comprise any number of signals or ports in either an analog or digital domain.

The logic decoder 226 receives the control signals and decodes the logic of the signals in order to control turning ON and OFF the transistors of the selectable transistor stack 228. The logic decoder 226 in this example comprises two AND gates selectively outputting a HI and LO signals to level shifters 210 and 212 in the selectable transistor stack section. The logic decoder may comprise AND gates, NAND gate, OR gates, NOR gates, XOR gates, inverters, buffers, and the like. The input to the logic decoder 226 may be either analog or digital and may output signals that are either analog or digital. In this example two output signals controlling two level shifters are shown, the number of individual outputs and level shifters are arbitrary and may comprise outputs to control any portion of the stack from all of the stack to individual transistors within the stack.

The selectable transistor stack 228 in this example is made up of at least two sub portions: a first lower portion M1 110, M2 112, M3 114, and a second upper portion M4 116, M5 118, M6 120. Depending upon design, any number of portions may be selected. This would depend in part upon the stack height and the capability of the tester. The control of the first portion of the stack of series coupled transistors is isolated from the control of the second portion of the stack of series coupled transistors. A level shifter is coupled to each portion of the stack. A first level shifter 210 is coupled to the first portion M1 110, M2 112, M3 114 and a second level shifter 212 is coupled to the second portion M4 116, M5 118, M6 120. Level shifters are coupled to the logic decoder 226 which inputs decoded signals controlling the output of the level shifters. In this example six transistors are shown, however, any number of transistors may be in the stack and may be controlled by the level shifters, any sub-portion of the stack down to individual transistors may be controlled by the logic decoder driven by the input control bus.

Figure 3:
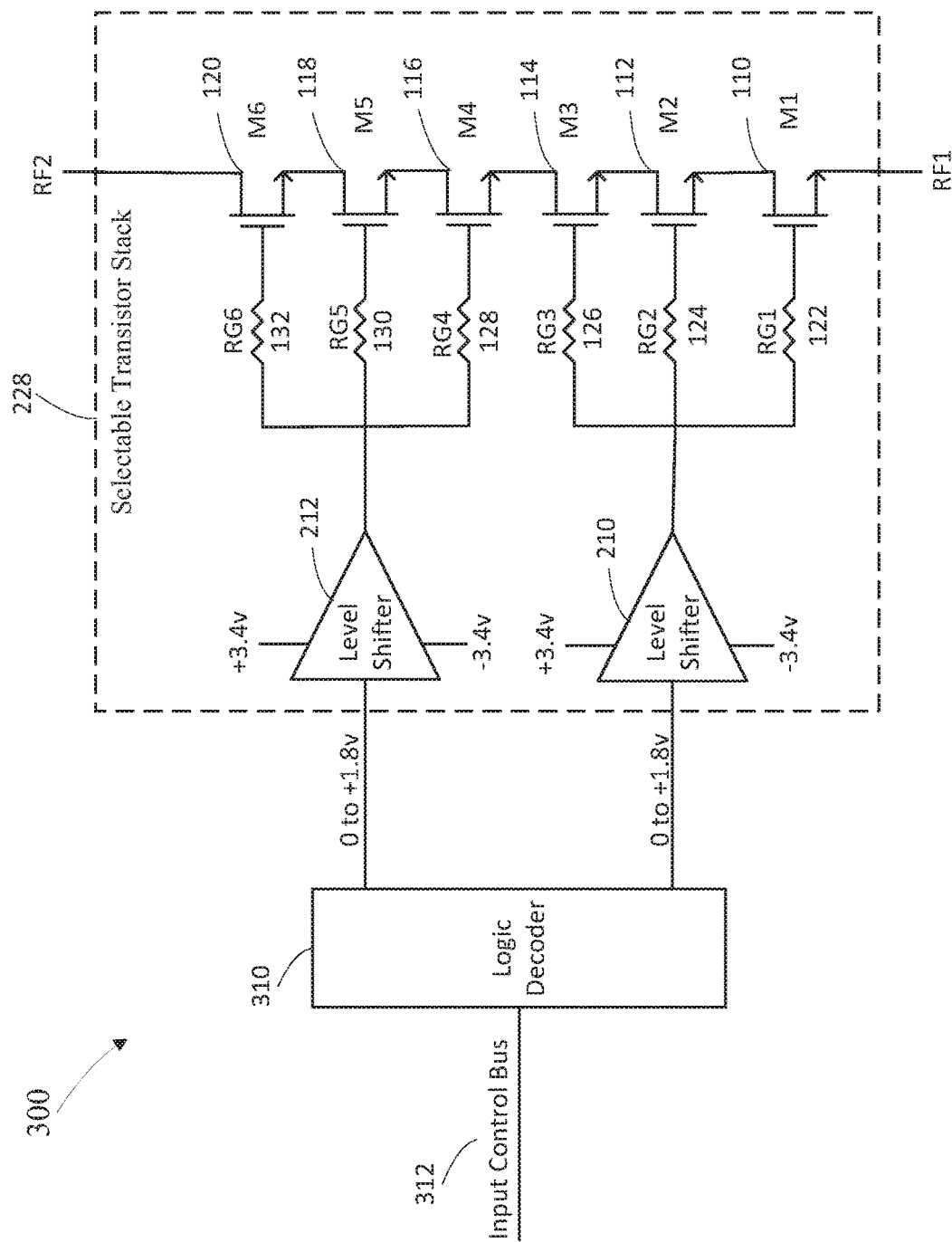
FIG. 3 is a second example system utilizing a logic decoder and batched transistors in accordance with one embodiment of the disclosure.

FIG. 3 is a modification of FIG. 2 and depicts a second embodiment of a stack of series coupled transistors M1 110, M2 112, M3 114, M4 116, M5 118 and M6 120 that have been designed for test. The selectable stack transistor 228 is the same as in FIG. 2.

In this example the input control bus 312 is a single digital input coupled to a logic decoder 310 which receives the digital input and controls the level shifters 210 and 212 of the selectable transistor stack 228. Although the input control bus is configured as a single digital line in this example, it may also be an analog bus of one or more lines.

The logic decoder 310 may be designed to accept any analog or digital input signal, decide on what the input signal intended and output any digital or analog signal necessary to control the drivers, which in this case are level shifters 210 and 212, of the selectable transistor stack 228.

Figure 4:
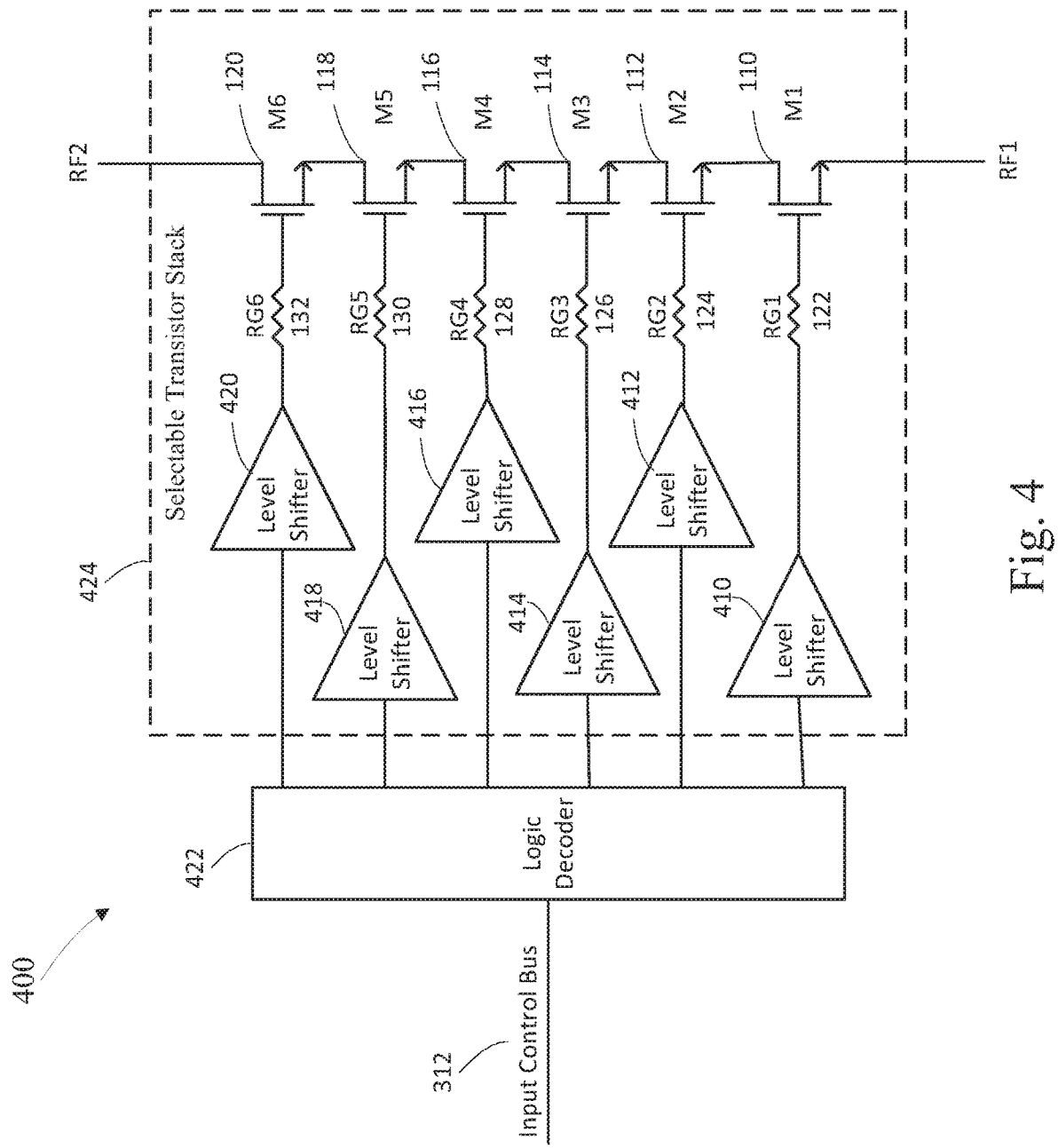
FIG. 4 is a third example system utilizing a logic decoder and individually selected transistors in accordance with one embodiment of the disclosure.

FIG. 4 depicts a third embodiment of the apparatus. In this example the input control bus 312 is the same as FIG. 3, the logic decoder 422 in this example allows for individual selection of level shifters 410, 412, 414, 416, 418, 420 which allows individual selection of transistors M1-M6. This allows complete control of the test pattern of the stack, whether it be grouped by proximity, alternating, function, or the like.

The logic decoder 422 may be designed to accept any analog or digital input signal, decide on what the input signal intended and output any digital or analog signal necessary to control the drivers, which in this case are level shifters 410, 412, 414, 416, 418 and 420, of the selectable transistor stack 424. The drivers may also include logic, buffers, inverters, individual gate resistors or direct connection to the transistors in the stack or the like, in addition to or in place of the level shifters in this example.

In this example the input control bus 312 and the logic decoder 422 of the stack of series coupled transistors M1 110, M2 112, M3 114, M4 116, M5 118 and M6 120 that have been designed for test allow individual transistor selection. The transistors M1 110, M2 112, M3 114, M4 116, M5 118 and M6 120 and gate resistors RG1 122, RG2 124, RG3 126, RG4 128, RG5 130 and RG6 132 are the same as in FIGS. 2 and 3.

The logic decoder 422 in this example selects a specific transistor M1 110, M2 112, M3 114, M4 116, M5 118 and M6 120 based on the input control bus 312 input signals. An appropriate level shifter 410, 412, 414, 416, 418 and 420 is selected and the appropriate transistor is tested. Although six transistors are shown, there may be any number of transistors in the stack. This embodiment allows for individual testing or confirmation of elements in the stack.

Figure 5:
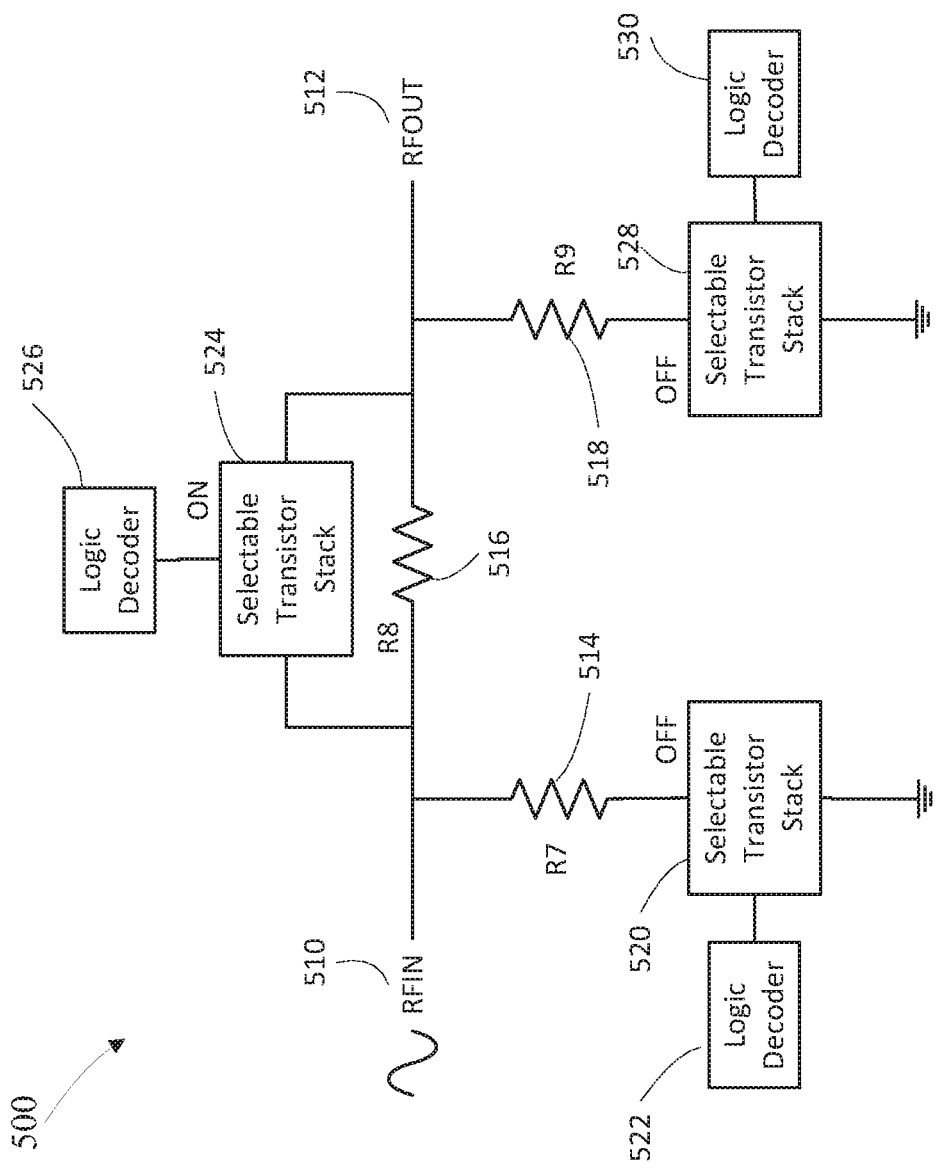
FIG. 5 is an example PI network utilizing a logic decoder in accordance with one embodiment of the disclosure.

FIG. 5 depicts a PI attenuator having three selectable transistor stacks 520, 524 and 528. These three stacks 520, 524, 526 may have similar construction as the selectable transistor stack 228 of FIG. 2 or 3 and 422 of FIG. 4, such that sub-portions of the stacks may be selectable down to the individual transistor level depending upon design. Additionally, the stacks 520, 524 and 526 may comprise any number of transistors in each of the stacks, and be different for each.

Selectable transistor stack 520 is controlled by logic decoder 522, stack 524 is controlled by logic decoder 526 and stack 528 is controlled by logic decoder 530. The logic decoders 522, 526 and 530 may have similar construction to the logic decoders 226 of FIG. 2, or 310 of FIG. 3 and 422 of FIG. 4.

Selectable transistor stack 520 is tied in series with resistor R7 514, stack 528 is tied to resistor R9 518 in series and resistors R7 514 and R9 518 are in series connection with resistor R8 516. Transistor stack 524 is coupled in parallel with resistor R8 516. RFIN 510 is input at the connection of R7 514 and R8 516 and RFOUT 512 is output at the connection of R8 516 and R9 518.

The selectable transistor stacks 520, 524 and 528 may be controlled in groups or individually as described previously in order to test sections using lower power levels, or investigate sections of the attenuator that might be contributing to non-linearities when debugging circuits or systems using the IC component. The technique described in the instant disclosure may be used to investigate different portions of an attenuator and its contributions to nonlinearity.

If attenuation is requested, the resistors R7 514, R8 516 and R9 518 would be included in the RF path, stacks 520 and 528 would be turned ON, and stack 524 would be turned OFF. In this way, the RFIN 510 signal would be grounded through R7 514 and R8 518 and would flow across R8 to the RFOUT 512.

If attenuation is not requested, selectable transistor stacks 520 and 528 would be turned OFF and stack 524 would be turned ON. Which would bypass the resistors and RFIN 510 would pass through stack 524 to RFOUT 512.

Testing turns ON and OFF alternate switches in the stack. In this example we see that the transistors in the stacks may be grouped by proximity, individually selected, grouped alternately or grouped by use.

Figure 6:
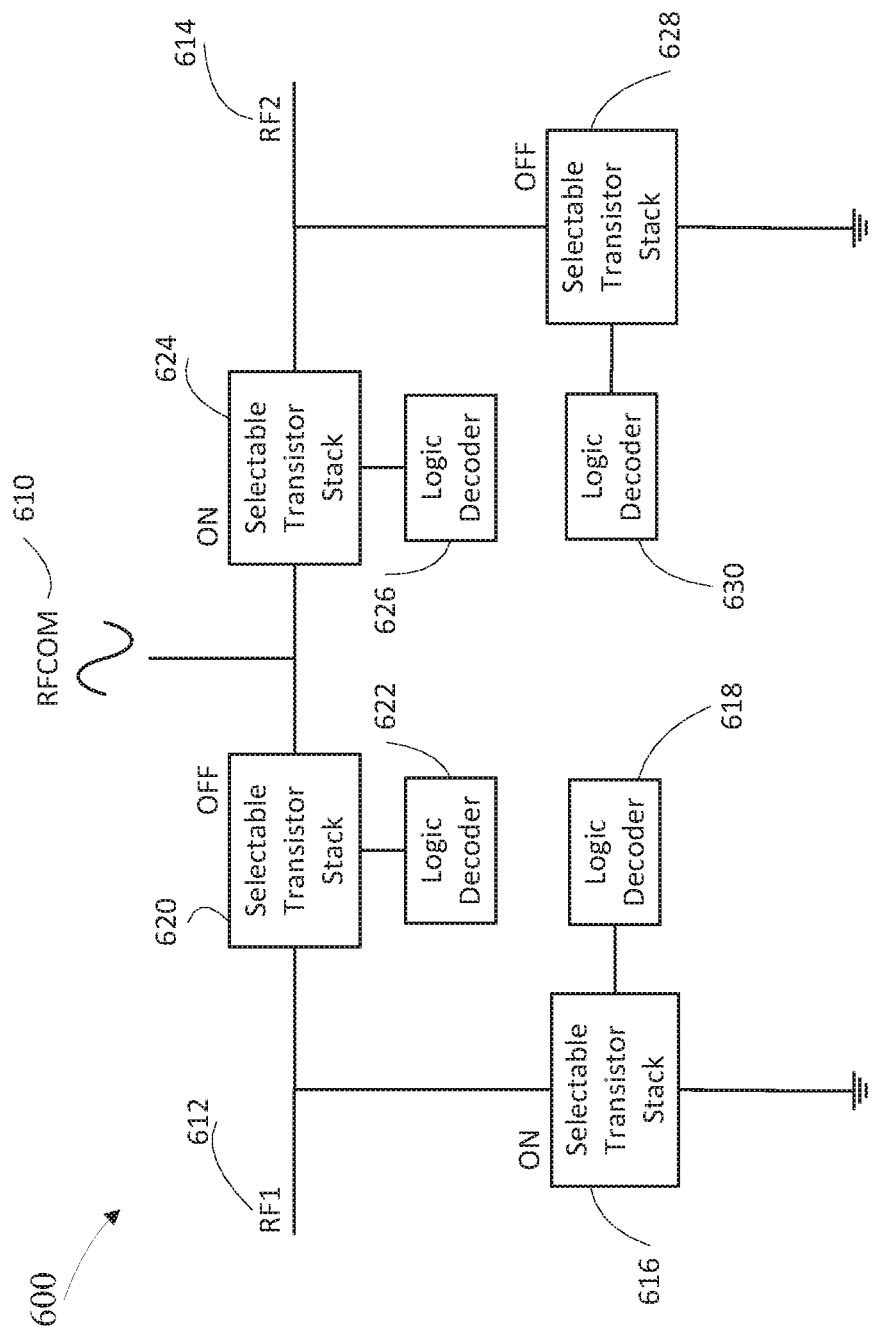
FIG. 6 is an example coupling network utilizing a logic decoder in accordance with one embodiment of the disclosure.

FIG. 6 depicts a single pole dual throw (SPDT) switch network. The switches are bi-directional so they can, for example, receive and transmit through the same switch. The RF common input RFCOM 610 of the circuit in use would be placed in this example in the center of the network.

In this example the selectable transistor stacks 616, 620, 624 and 628 may have similar construction as the selectable transistor stack 228 of FIG. 2 and 424 of FIG. 4, such that sub-portions of the stacks may be selectable down to the individual transistor level depending upon design. Additionally, the stacks 616, 620, 624 and 628 may comprise any number of transistors in the stacks.

Stacks 616, 620, 624 and 628 are controlled by logic decoders 618, 622, 626 and 628 respectively. The logic decoders 616, 620, 624 and 628 may have similar construction to the logic decoders 226 of FIG. 2, or 310 of FIGS. 3 and 4.

In this example, stacks 616 and 624 are turned ON, and stacks 620 and 628 are turned OFF establishing a low loss thru path from RFCOM 610 to RF2 614. In this state the power handling of the selectable stack 620 and 628 may then be measured.

Alternately, stacks 620 and 628 are turned ON and stacks 616 and 624 are turned OFF establishing a low loss path from RFCOM 610 to RF1 612. In this state the power handling of the selectable stacks 616 and 624 may be measured. Although an SPDT switch network is shown, the switch network may be single pole multi throw (SPMT) and multi pole multi throw MPMT, and the like.

Figure 7:
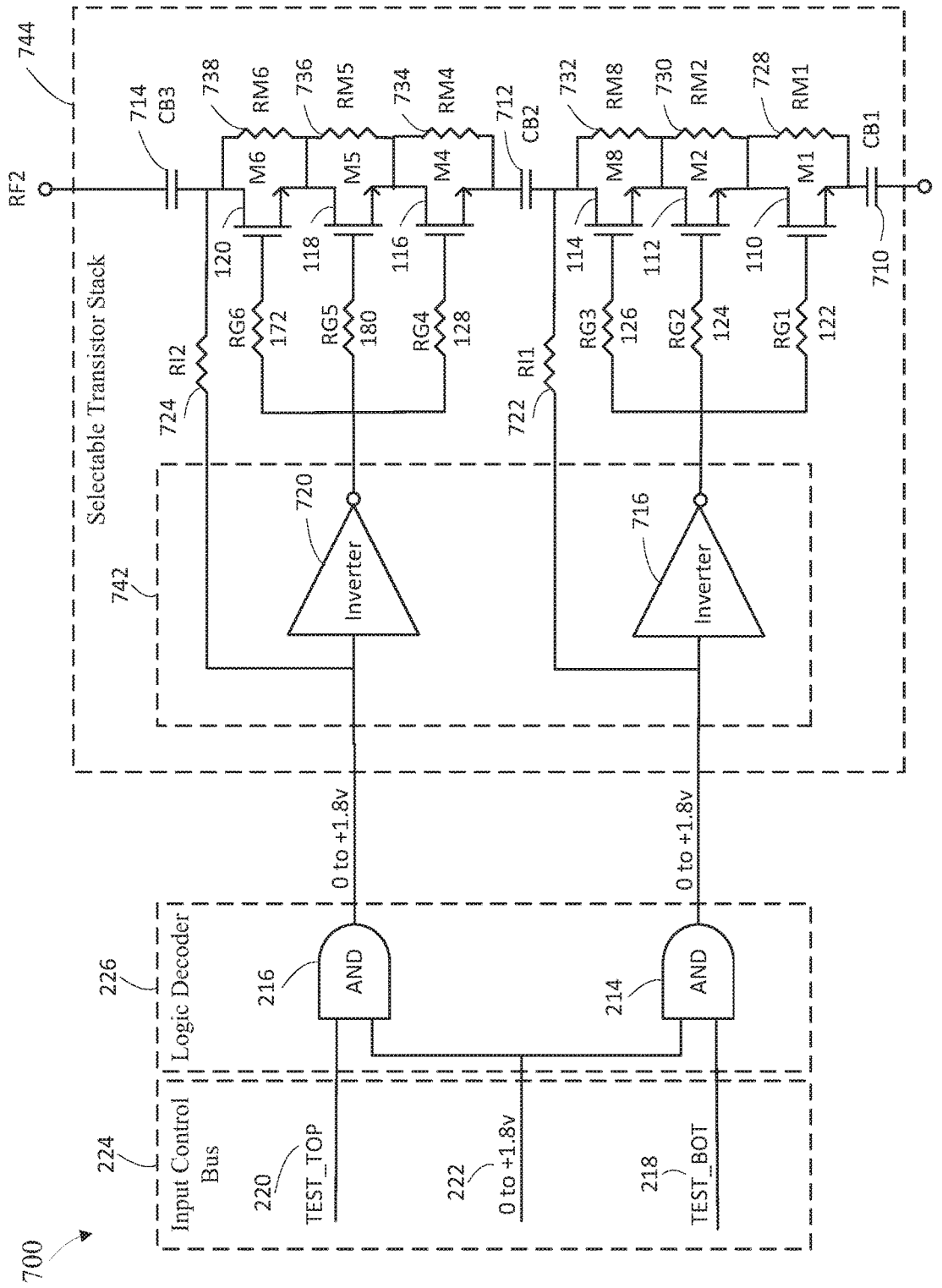
FIG. 7 is a fourth example system utilizing a positive voltage and blocking capacitors in accordance with one embodiment of the disclosure.

FIG. 7 is a modification of FIG. 2. The system still comprises an input control bus 224, a logic decoder 226 and a selectable transistor stack 744. The function and structure of the input control bus 224 and logic decoder 226 in this example are identical to those found in FIG. 2. However, in this case a set of inverters 742, comprised of individual inverters 716 and 720 drives the selectable stack instead of using a level shifter.

In this example, the circuit has been simplified in that the negative and positive voltages provided by a charge pump are not utilized, but merely positive voltages. In this example, the inverters 716 and 720 modulate the portions of the stack and inverter resistors RI1 722 and RI2 724 set the voltage of the sources and drains for those portions of the stack to which they are connected. CB1 710, CB2 712 and CB3 714 are used to isolate the portions of the stack. Resistors RM1 728, RM2 730, RM3 732, RM4 734, RM5 736, and RM6 738 are used to remove trapped charge from the source/drain nodes when the transistor is in the OFF state.

In this example the FETs are biased using positive voltages. Such a configuration uses DC blocking capacitors so that a voltage inverter can be connected between gate and drain/source. A voltage of +3V on gate and 0V on Source/Drain turns the FET ON, and a voltage of 0V on gate and +3V on source/drain turns the FET OFF. This example depicts the use of DC blocking capacitors if avoidance of a charge pump is sought for noise or die area reasons. As should be readily apparent to one of ordinary skill in the art, there are multiple means and methods of implementing the gate control such as level shifters, logic, buffers, inverters, individual gate resistors or direct connection to the transistors in the stack or the like.

Figure 8:
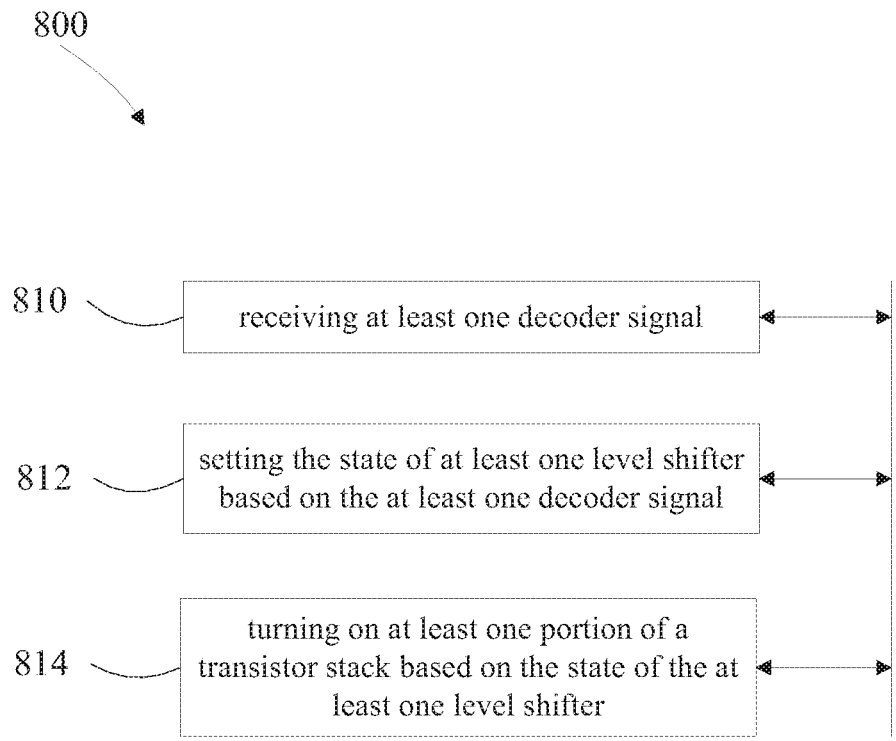
FIG. 8 is a first example method in accordance with one embodiment of the disclosure.

FIG. 8 depicts a first method of testing a transistor stack comprising, receiving 810 at least one decoder signal, setting 812 the state of the at least one level shifter based on the at least one decoder signal and turning ON 814 at least one portion of the transistor stack based on the state of the at least one level shifter.

Figure 9:
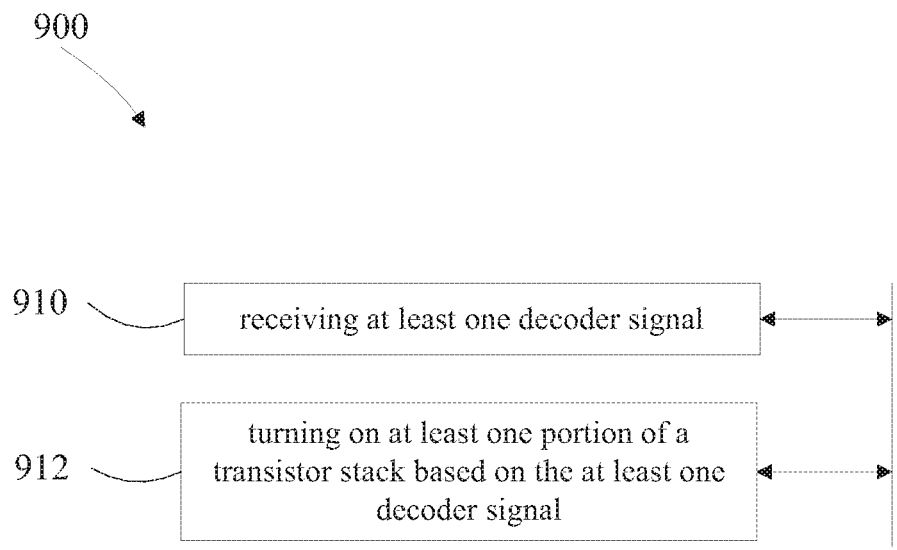
FIG. 9 is a second example method in accordance with one embodiment of the disclosure.

FIG. 9 depicts a first method of testing a transistor stack comprising receiving 910 at least one decoder signal and directly turning ON 912 at least one portion of the transistor stack based on the at least one decoder signal. This method would apply at least in the case where a level shifter is not designed into the system.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

The device described may be applicable to three terminal devices other than FETs, such as bipolar junction transistors (BJT), heterojunction bipolar transistors (HBT), NPNs, PNPs and the like. Additionally, it is envisioned that the disclosed device may be applicable to two terminal devices such as diodes and the like which may be ganged into sub-portions for testing.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, GaAs HBT and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A system comprising:
    a switch comprising a stack of series coupled transistors having at least two stack sub-portions;
    at least one logic decoder coupled to said at least two stack sub-portions, the at least one logic decoder being configured to independently control each of the at least two stack sub-portions; and
    a first and second RF connection at opposite ends of the stack connected to a test set such that, upon the at least one logic decoder turning ON transistors of a first stack sub-portion of the at least two stack sub-portions, the test set is configured to test a second stack sub-portion of the at least two stack sub-portions at a test voltage such that voltages across OFF transistors of the second stack sub-portion is higher than if the test voltage were applied across the stack with all transistors of the stack being OFF.

2. The system of claim 1 wherein said at least one logic decoder is comprised of at least one of an AND gate, a NAND gate, an OR gate and a NOR gate.

3. The system of claim 1 wherein said at least two stack sub-portions are grouped by proximity.

4. The system of claim 1 wherein said at least two stack sub-portions are grouped in alternating sequence.

5. The system of claim 1 wherein said at least two stack sub-portions are grouped by function.

6. The system of claim 1 further comprising at least one bridging resistor coupling at least one source of said at least one of said stack of series coupled transistors to at least one drain of said at least one of said stack of series coupled transistors.

7. A system comprising:
    a switch comprising a stack of series coupled transistors having at least two stack sub-portions;
    at least one level shifter coupled to at least one stack sub-portion of said at least two stack sub-portions;
    at least one logic decoder coupled to said at least one level shifter, the at least one logic decoder being configured to independently control each of the at least two stack sub-portions; and
    a first and second RF connection at opposite ends of the stack connected to a test set such that, upon the at least one logic decoder turning ON transistors of a first stack sub-portion of the at least two stack sub-portions, the test set is configured to test a second stack sub-portion of the at least two stack sub-portions at a test voltage such that voltages across OFF transistors of the second stack sub-portion is higher than if the test voltage were applied across the stack with all transistors of the stack being OFF.

8. The system of claim 7 wherein said at least one logic decoder is comprised of at least one of an AND gate, a NAND gate, an OR gate and a NOR gate.

9. The system of claim 7 wherein said at least two stack sub-portions are grouped by proximity.

10. The system of claim 7 wherein said at least two stack sub-portions are grouped in alternating sequence.

11. The system of claim 7 wherein said at least two stack sub-portions are grouped by function.

12. The system of claim 7 further comprising at least one bridging resistor coupling at least one source of said at least one of said stack of series coupled transistors to at least one drain of said at least one of said stack of series coupled transistors.

13. A system comprising:
    a switch comprising a stack of series coupled transistors having a first stack sub-portion and a second stack sub-portion;
    a first level shifter coupled to said first stack sub-portion;
    a second level shifter coupled to said second stack sub-portion; and
    a logic decoder coupled to said first level shifter and said second level shifter, the logic decoder being configured to independently control each of said first stack sub-portion and said second stack sub-portion; and
    a first and second RF connection at opposite ends of the stack connected to a test set such that, upon the at least one logic decoder turning ON transistors of a first stack sub-portion of the at least two stack sub-portions, the test set is configured to test a second stack sub-portion of the at least two stack sub-portions at a test voltage such that voltages across OFF transistors of the second stack sub-portion is higher than if the test voltage were applied across the stack with all transistors of the stack being OFF.

14. The system of claim 13 wherein said logic decoder is comprised of at least one of an AND gate, a NAND gate, an OR gate and a NOR gate.

15. The system of claim 13 wherein said logic decoder is a first AND gate having a first AND gate output coupled to said first level shifter and a second AND gate having a second AND gate output coupled to said second level shifter.

16. The system of claim 13 wherein said first stack sub-portion and said second stack sub-portion are grouped by proximity.

17. The system of claim 13 wherein said first stack sub-portion and said second stack sub-portion are grouped by function.

18. The system of claim 13 further comprising at least one bridging resistor coupling at least one source of said at least one of said stack of series coupled transistors to at least one drain of said at least one of said stack of series coupled transistors.

19. A stack of series coupled transistors comprising:
    at least one of said stack of series coupled transistors having at least one gate, at least one drain and at least one source;
    at least one blocking capacitor coupled to at least one of said at least one drain and at least one source;
    at least one inverter having at least one inverter output coupled to said at least one gate and at least one inverter input coupled to at least one of said at least one drain and at least one source; and
    at least one logic decoder coupled to said at least one inverter to select said at least one inverter.

20. The stack of series coupled transistors of claim 19 further comprising at least one bridging resistor coupling at least one source of said at least one of said stack of series coupled transistors to at least one drain of said at least one of said stack of series coupled transistors.

21. A method of testing a stack of series coupled transistors having at least two stack sub-portions, the method comprising:
    receiving at least one decoder signal;
    controlling independently each stack sub-portion based on the received at least one decoder signal, wherein the controlling includes turning ON transistors of a first stack sub-portion and turning OFF transistors of a second stack sub-portion; and
    applying a test voltage across the stack at a voltage such that voltages across each of the series of coupled transistors of the second stack sub-portion is at a test voltage such that voltages across each of the series coupled transistors of the second stack sub-portion are at a level equivalent to voltages if a full stack test voltage were to be applied across the stack, wherein the test voltage is lower than if the test voltage were applied across the stack with all transistors of the stack being OFF to achieve the voltages across each of the series coupled transistors of the second stack sub-portion.

22. The method of claim 21 wherein said at least one decoder signal is received from a tester.

* * * * *